United States Patent
Chen et al.

(10) Patent No.: US 12,013,452 B2
(45) Date of Patent: Jun. 18, 2024

(54) MULTI-CONTRAST MRI SAMPLING AND IMAGE RECONSTRUCTION

(71) Applicant: Shanghai United Imaging Intelligence Co., Ltd., Shanghai (CN)

(72) Inventors: Xiao Chen, Cambridge, MA (US); Zhang Chen, Brookline, MA (US); Yikang Liu, Cambridge, MA (US); Shanhui Sun, Lexington, MA (US); Terrence Chen, Lexington, MA (US); Lin Zhao, Athens, GA (US)

(73) Assignee: Shanghai United Imaging Intelligence Co., Ltd., Shanghai (CN)

( * ) Notice: Subject to any disclaimer, the term of this patent is extended or adjusted under 35 U.S.C. 154(b) by 161 days.

(21) Appl. No.: 17/741,307

(22) Filed: May 10, 2022

(65) Prior Publication Data

US 2023/0366964 A1    Nov. 16, 2023

(51) Int. Cl.
*G01R 33/56* (2006.01)
*G01R 33/561* (2006.01)
*G06N 3/045* (2023.01)
*G06N 3/08* (2023.01)

(52) U.S. Cl.
CPC ...... *G01R 33/5608* (2013.01); *G01R 33/5611* (2013.01); *G06N 3/045* (2023.01); *G06N 3/08* (2013.01)

(58) Field of Classification Search
CPC ...... G06N 3/045; G06N 3/08; G01R 33/5608; G01R 33/5611
See application file for complete search history.

(56) References Cited

U.S. PATENT DOCUMENTS

| | | | |
|---|---|---|---|
| 9,928,576 B2 | 3/2018 | Hwang | |
| 11,682,145 B2* | 6/2023 | Zeller | G06T 5/50 |
| | | | 382/131 |
| 2016/0054418 A1 | 2/2016 | Doneva et al. | |
| 2019/0355125 A1* | 11/2019 | Park | G06T 7/174 |
| 2020/0311926 A1* | 10/2020 | Tian | G06T 3/4053 |

OTHER PUBLICATIONS

Aggarwal et al., J-modl: Joint model-based deep learning for optimized sampling and reconstruction. IEEE Journal of Selected Topics in Signal Processing, 14(6):1151-1162, Jul. 2, 2020.

(Continued)

*Primary Examiner* — Gregory H Curran
(74) *Attorney, Agent, or Firm* — Zhong Law LLC (57) ABSTRACT

Described herein are systems, methods, and instrumentalities associated with reconstruction of multi-contrast magnetic resonance imaging (MRI) images. The reconstruction may be performed based on under-sampled MRI data collected for the multiple contrasts using corresponding sampling patterns. The sampling patterns and the reconstruction operations for the multiple contrasts may be jointly optimized using deep learning techniques implemented through one or more neural networks. An end-to-end reconstruction optimizing framework is provided with which information collected while processing one contrast may be stored and used for another contrast. A differentiable sampler is described for obtaining the under-sampled MRI data from a k-space and a novel holistic recurrent neural network is used to reconstruct MRI images based on the under-sampled MRI data.

18 Claims, 7 Drawing Sheets

(56) References Cited

OTHER PUBLICATIONS

Bahadir, et al., Learning-based optimization of the under-sampling pattern in mri. In International Conference on Information Processing in Medical Imaging, pp. 780-792. Springer, Apr. 30, 2019.

Bahadir et al., Deep-learning-based optimization of the undersampling pattern in mri. IEEE Transactions on Computational Imaging, 6:1139-1152, 2020.

Bakker, et al. Experimental design for mri by greedy policy search. Advances in Neural Information Processing Systems, 33, Dec. 15, 2020.

Bilgic et al. Multi-contrast reconstruction with bayesian compressed sensing. Magnetic resonance in medicine, 66 (6):1601-1615, Dec. 2011.

Bora et al. Compressed sensing using generative models. In International Conference on Machine Learning, pp. 537-546. PMLR, Mar. 9, 2017.

Cho et al., Learning Phrase Representations using RNN Encoder-Decoder for Statistical Machine Translation. arXiv preprint arXiv:1406.1078, Sep. 3, 2014.

Dar et al., Prior-Guided Image Reconstruction for Accelerated Multi-Contrast MRI via Generative Adversarial Networks. IEEE Journal of Selected Topics in Signal Processing, 14(6):1072-1087, Oct. 2020.

Ehrhardt et al., Multi-Contrast MRI Reconstruction with Structure-Guided Total Variation. SIAM Journal on Imaging Sciences, 9(3):1084-1106, Nov. 20, 2015.

Goodfellow et al., Generative Adversarial Networks. Advances in neural information processing systems, Jun. 10, 2014.

Hammernik et al., Learning a variational network for reconstruction of accelerated MRI data, Magnetic resonance in medicine, 79(6):3055-3071, Jun. 2018.

Han et al., K-space deep learning for accelerated MRI, IEEE transactions on medical imaging, 39(2):377-386, Jul. 5, 2019.

Huang et al., Fast Multi-contrast MRI Reconstruction, Magnetic resonance imaging, 32(10):1344-1352, Dec. 2014.

Huang et al., Bayesian Nonparametric Dictionary Learning for Compressed Sensing MRI, IEEE Transactions on Image Processing, 23(12):5007-5019, Dec. 2014.

Hyun et al., Deep learning for undersampled MRI reconstruction. Physics in Medicine & Biology, 63(13):135007, Jun. 25, 2018.

Jin et al., Self-Supervised Deep Active Accelerated MRI. arXiv preprint arXiv:1901.04547, Jan. 14, 2019.

Jun et al., Joint Deep Model-based MR Image and Coil Sensitivity Reconstruction Network (Joint-ICNet) for Fast MRI. In Proceedings of the IEEE/CVF Conference on Computer Vision and Pattern Recognition, pp. 5270-5279, Jun. 2021.

Kingma et al., Adam: A method for stochastic optimization. arXiv preprint arXiv:1412.6980, Dec. 22, 2014.

Lei et al., Wasserstein GANs for MR Imaging: from Paired to Unpaired Training, IEEE transactions on medical imaging, 40(1):105-115, Sep. 8, 2020.

Liu et al., Balanced sparse model for tight frames in compressed sensing magnetic resonance imaging. PloS one, 10(4):e0119584, Apr. 7, 2015.

Lustig et al., Sparse MRI: The application of compressed sensing for rapid MR imaging. Magnetic Resonance in Medicine: An Official Journal of the International Society for Magnetic Resonance in Medicine, 58(6):1182-1195, Oct. 29, 2007.

Mardani, et al. Deep Generative Adversarial Networks for Compressed Sensing Automates MRI. arXiv preprint arXiv:1706.00051, May 31, 2017.

Paszke, et al. Pytorch: An imperative style, high-performance deep learning library. Advances in neural information processing systems, 32:8026-8037, 2019.

Pineda et al., Active MR k-space Sampling with Reinforcement Learning. In International Conference on Medical Image Computing and Computer-Assisted Intervention, pp. 23-33. Springer, Oct. 7, 2020.

Qu et al., ItIterative thresholding compressed sensing MRI based on contourlet transform. Inverse Problems in Science and Engineering, 18(6):737-758, Aug. 9, 2010.

Quan et al., Compressed Sensing MRI Reconstruction Using a Generative Adversarial Network With a Cyclic Loss. IEEE transactions on medical imaging, 37(6):1488-1497, Mar. 28, 2018.

Ravishankar et al., MR image reconstruction from highly undersampled k-space data by dictionary learning. IEEE transactions on medical imaging, 30(5):1028-1041, Nov. 1, 2010.

Ronneberger et al., U-Net: Convolutional Networks for Biomedical Image Segmentation, In International Conference on Medical image computing and computer-assisted intervention, pp. 234-241. Springer, May 18, 2015.

Sanchez et al., Scalable Learning-Based Sampling Optimization for Compressive Dynamic MRI. In ICASSP 2020-2020 IEEE International Conference on Acoustics, Speech and Signal Processing (ICASSP), pp. 8584-8588. IEEE, Mar. 16, 2020.

Schlemper et al., A Deep Cascade of Convolutional Neural Networks for MR Image Reconstruction. IEEE transactions on Medical Imaging, 37(2):491-503, Mar. 1, 2017.

Seitzer et al., Adversarial and Perceptual Refinement for Compressed Sensing MRI Reconstruction, In International conference on medical image computing and computer-assisted intervention, pp. 232-240. Springer, Jun. 28, 2018.

Sherry et al., Learning the Sampling Pattern for MRI, IEEE Transactions on Medical Imaging, 39(12):4310-4321, Nov. 3, 20200.

Song et al., Coupled Dictionary Learning for Multi-contrast MRI Reconstruction. IEEE transactions on medical imaging, 39(3):621-633, Aug. 2, 2019.

Sriram et al., End-to-End Variational Networks for Accelerated MRI Reconstruction. In International Conference on Medical Image Computing and Computer-Assisted Intervention, pp. 64-73. Springer, Apr. 14, 2020.

Sriram et al., GrappaNet: Combining Parallel Imaging With Deep Learning for Multi-Coil MRI Reconstruction, In Proceedings of the IEEE/CVF Conference on Computer Vision and Pattern Recognition, pp. 14315-14322, Aug. 5, 2020.

Taylor et al., T1 mapping: basic techniques and clinical applications. JACC: Cardiovascular Imaging, 9(1):67-81, Jan. 2016.

Tsao et al., MRI temporal acceleration techniques. Journal of Magnetic Resonance Imaging, 36(3):543-560, Aug. 17, 2012.

Wang et al., Accelerating magnetic resonance imaging via deep learning. In 2016 IEEE 13th international symposium on biomedical imaging (ISBI), pp. 514-517. IEEE, Jun. 16, 2016.

Wang et al., Recurrent U-Net for Resource-Constrained Segmentation, In Proceedings of the IEEE/CVF International Conference on Computer Vision, pp. 2142-2151, Jun. 11, 2019.

Wang et al., Image quality assessment: from error visibility to structural similarity. IEEE transactions on image processing, 13(4):600-612, Apr. 2004.

Weiss et al., Joint learning of cartesian undersampling and reconstruction for accelerated MRI. In ICASSP 2020-2020 IEEE International Conference on Acoustics, Speech and Signal Processing (ICASSP), pp. 8653-8657. IEEE, Apr. 5, 2020.

Welsch et al., T2 and t2* mapping. Current Radiology Reports, 2(8):60, Jun. 20, 2014.

Xuan et al., Learning MRI k-Space Subsampling Pattern Using Progressive Weight Pruning. In International Conference on Medical Image Computing and Computer-Assisted Intervention, pp. 178-187. Springer, 2020.

Xuan et al., Multi-Modal MRI Reconstruction Assisted with Spatial Alignment Network, arXiv preprint arXiv:2108.05603, 2021.

Yang et al., DAGAN: Deep De-Aliasing Generative Adversarial Networks for Fast Compressed Sensing MRI Reconstruction IEEE transactions on medical imaging, 37(6):1310-1321, Jun. 2018.

Yin et al., End-to-End Sequential Sampling and Reconstruction for MRI, arXiv preprint arXiv:2105.06460, May 13, 2021.

Zbontar, et al. fastMRI: An Open Dataset and Benchmarks for Accelerated MRI. arXiv preprint arXiv:1811.08839, 2018.

Zhang et al., Reducing Uncertainty in Undersampled MRI Reconstruction with Active AcquisitionIn Proceedings of the IEEE/CVF Conference on Computer Vision and Pattern Recognition, pp. 2049-2058, Feb. 8, 2019.

(56) References Cited

OTHER PUBLICATIONS

Zhou et al., DuDoRNet: Learning a Dual-Domain Recurrent Network for Fast MRI Reconstruction with Deep T1 Prior. In Proceedings of the IEEE/CVF Conference on Computer Vision and Pattern Recognition, pp. 4273-4282, Jan. 11, 2020.

Zhu et al., Image reconstruction by domain-transform manifold learning. Nature, 555(7697):487-492, Mar. 22, 2018.

* cited by examiner

MULTI-CONTRAST MRI SAMPLING AND IMAGE RECONSTRUCTION

BACKGROUND

Magnetic resonance imaging (MRI) has become a very important tool for disease detection, diagnosis, and treatment monitoring. An MRI study of an anatomical structure such as the brain may involve multiple images including a T1-weighted image, a T2-weighted image, a fluid attenuated inversion recovery (FLAIR) image, etc., each of which may be associated with a unique contrast. Since MRI is an intrinsically slow imaging technique, such a multi-contrast MRI study may need to be accelerated. Conventional acceleration techniques treat each contrast independently during sampling and reconstruction, with a goal to achieve optimal results for each individual contrast. Using these techniques, sampling patterns and reconstruction algorithms applied to different contrasts are determined separately from each other, without leveraging information that may be shared among the contrasts. As a result, while the image obtained for each contrast may be optimized, the outcome of the entire MRI study may become sub-optimal (e.g., with respect to reconstruction quality and/or acquisition time). Accordingly, systems, methods, and instrumentalities are desired for improving the quality of multi-contrast MRI studies.

SUMMARY

Described herein are systems, methods, and instrumentalities associated with reconstruction of multi-contrast magnetic resonance imaging (MRI) images based on under-sampled MRI data for the multiple contrasts (e.g., T1-weighted, T2-weighted, etc.). An apparatus configured to perform the image reconstruction tasks may include one or more processors that are configured to obtain first under-sampled MRI data associated with a first contrast (e.g., T1-weighted) and reconstruct, using an artificial neural network (ANN), a first MRI image for the first contrast, wherein the reconstruction of the first MRI image may comprise determining a first plurality of characteristics (e.g., features) of the first under-sampled MRI data and predicting the first MRI image based on the first plurality of characteristics of the first under-sampled MRI data. The one or more processors may be further configured to obtain second under-sampled MRI data associated with a second contrast and reconstruct, using the ANN, a second MRI image for the second contrast, wherein the reconstruction of the second MRI image comprises determining a second plurality of characteristics of the second under-sampled MRI data and predicting the second MRI image based on the second plurality of characteristics of the second under-sampled MRI data and at least a subset of the first plurality of characteristics of the first under-sampled MRI data.

In examples, the first under-sampled MRI data described herein may be derived using a first sampling pattern (e.g., a first sampling mask), the second under-sampled MRI data may be derived using a second sampling pattern (e.g., a second sampling mask), and the first sampling pattern and the second sampling pattern may be jointly determined or optimized (e.g., together with parameters of the ANN).

In examples, the ANN may be trained in a process that includes applying a first estimated sampling pattern to an MRI training dataset to obtain first under-sampled MRI training data, applying a second estimated sampling pattern to the MRI training dataset to obtain second under-sampled MRI training data, generating, using preliminary parameters of the ANN, a first reconstructed MRI image based on the first under-sampled MRI training data, generating, using the preliminary parameters of the ANN, a second reconstructed MRI image based on the second under-sampled MRI training data, and adjusting at least one of the first estimated sampling pattern, the second estimated sampling pattern, or the preliminary parameters of the ANN based on respective ground truths associated with the first reconstructed MRI image and the second reconstructed MRI image.

In examples, the first sampling pattern and the second sampling pattern described herein may respectively correspond to a first differentiable probability mask and a second differentiable probability mask, which allow a loss determined during training of the ANN to be backpropagated through the network. In examples, the ANN may include a recurrent neural network (RNN) configured to determine the first plurality of characteristics of the first under-sampled MRI data and store the first plurality of characteristics as a hidden state of the first MRI image associated with the first contrast. The RNN may be further configured to determine the second plurality of characteristics of the second under-sampled MRI data and store the second plurality of characteristics as a hidden state of the second MRI image associated with the second contrast. The RNN may be configured to reconstruct the second MRI image based on the hidden state of the first MRI image. In examples, the RNN may comprise a plurality of decoder layers each of which may be configured to determine, as a part of the hidden state of the first contrast, a respective first set of up-sampled features of the first under-sampled MRI data and determine, as a part of the hidden state of the second contrast, a respective second set of up-sampled features of the second under-sampled MRI data. In examples, the respective first set of up-sampled features of the first under-sampled MRI data may be used by the each of the plurality of decoder layers to determine the respective second set of up-sampled features of the second under-sampled MRI data.

In examples, the RNN described herein may include a plurality of network blocks and each of the network blocks may comprise a plurality of encoder layers, a plurality of decoder layers, and a data consistency (DC) layer configured to ensure that the MRI image reconstructed for a contrast be consistent with the actual MRI data.

BRIEF DESCRIPTION OF THE DRAWINGS

A more detailed understanding of the examples disclosed herein may be had from the following description, given by way of example in conjunction with the accompanying drawing.

DETAILED DESCRIPTION

The present disclosure is illustrated by way of example, and not by way of limitation, in the figures of the accompanying drawings.

Figure 1:
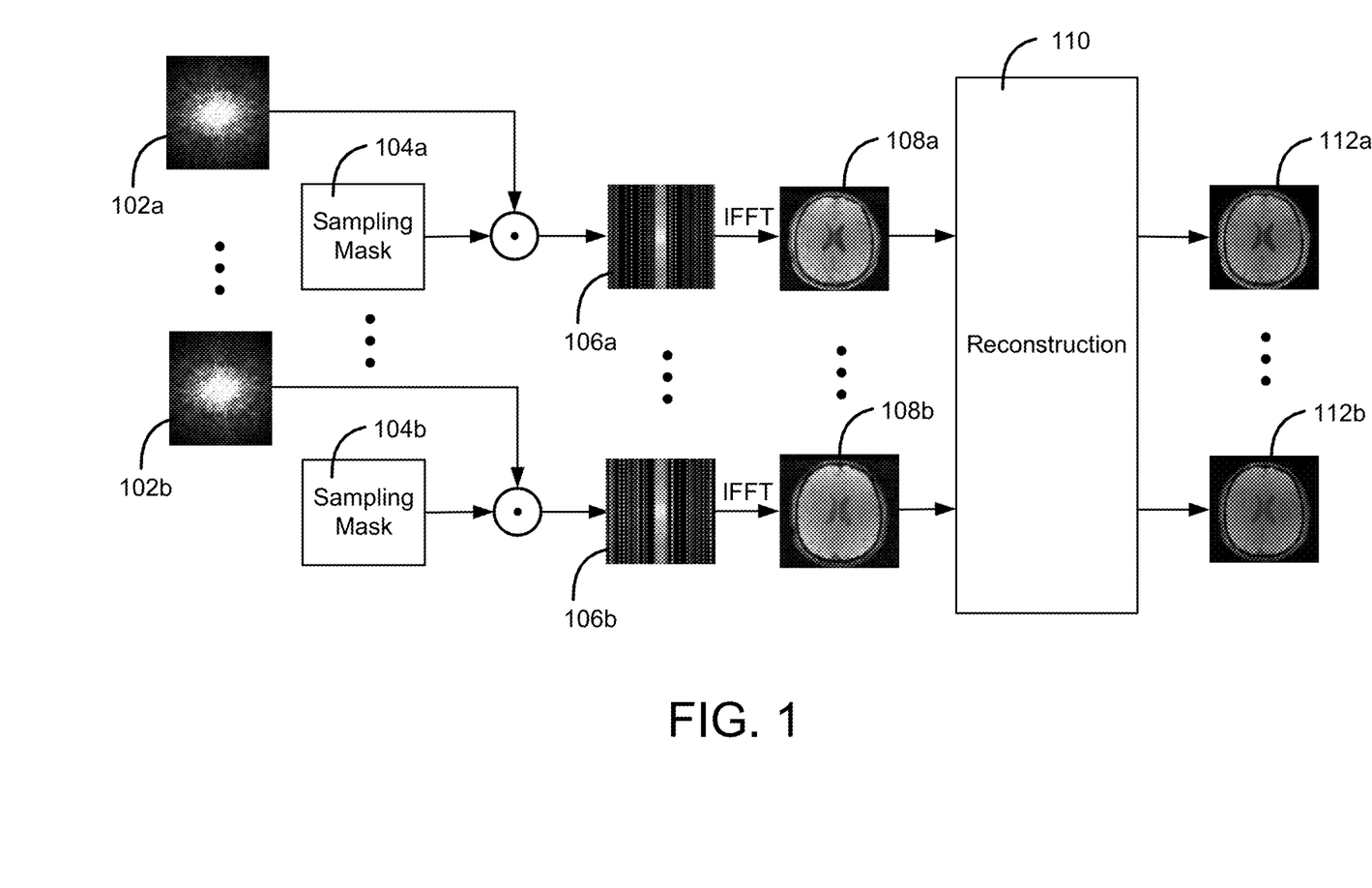
FIG. 1 is a simplified block diagram illustrating example operations that may be associated with multi-contrast MRI image generation in accordance with one or more embodiments describe herein.

FIG. 1 illustrates example operations that may be associated with multi-contrast MRI image generation. Two contrasts are shown in the figure and described herein, but those skilled in the art will appreciate that the disclosed techniques may be used to obtain images of more than two contrasts. As shown, MRI images of anatomical structure such as the brain may be generated based on spatial, frequency, and/or phase information (e.g., 102*a* and 102*b* shown in FIG. 1) associated with the anatomical structure and such information may be interchangeably referred to herein as k-space, k-space data, or k-space information. For certain MRI studies, data associated with different contrasts (e.g., T1-weighted, T2-weighted, fluid attenuated inversion recovery (FLAIR), etc.) may be collected from a k-space and to accelerate the data collection process, respective sampling patterns (e.g., 104*a* and 104*b* shown in FIG. 1) may be used to under-sample the k-space to obtain under-sampled MRI data (e.g., 106*a* and 106*b* shown in FIG. 1) for the different contrasts. In examples, the sampling patterns for the different contrasts may be represented by respective sampling masks that may indicate where in the k-space MRI data is to be collected and/or where in the k-space MRI data is not to be collected.

Once collected, under-sampled MRI data 106*a* and 106*b* for the multiple contrasts may be used to obtain corresponding MRI images (e.g., 108*a* and 108*b* shown in FIG. 1), for example, by applying inverse fast Fourier transform (IFFT) to the under-sampled MRI data (the term "under-sampled MRI data" may be used interchangeably herein with the term "under-sampled MRI image"). MRI images 108*a* and 108*b* may then be reconstructed (e.g., by recontructor 110 shown in FIG. 1) to recover the details lost due to the under-sampling and/or to remove the artifacts (e.g., such as aliasing artifacts) caused by the under-sampling. As a result of the reconstruction, respective MRI images (e.g., 112*a* and 112*b* shown in FIG. 1) for the multiple contrasts may be generated with improved quality (e.g., having the same or substantially similar quality as images generated based on fully sampled k-space data). The multi-contrast MRI images thus generated may be used to facilitate various downstream tasks including, e.g., segmentation of a pathological region, T1 mapping, where the multiple contrast MRI images may be fitted to an exponential recovery signal model to calculate the T1 value for each image pixel, etc.

Sampling patterns for multi-contrast MRI images may be determined and the reconstruction operations may be performed for the multiple contrasts by taking into consideration information that may be shared by the multiple contrasts (e.g., since the underlying object is the same for the multiple contrasts). By performing the sampling and/or reconstruction tasks in this joint manner, the overall quality and speed of the tasks may be improved.

Figure 2:
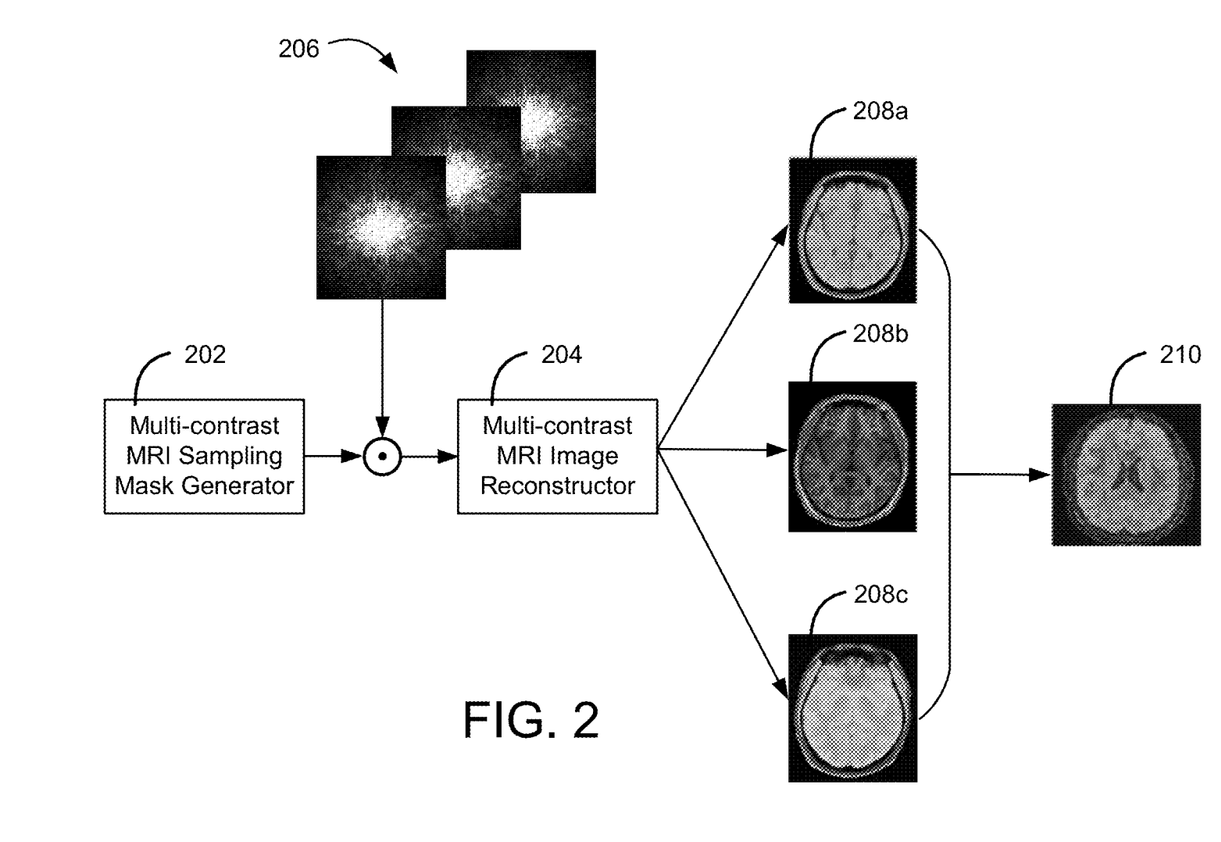
FIG. 2 is a simplified block diagram illustrating an example of jointly determining the patterns for sampling a k-space to obtain under-sampled MRI data for multiple contrasts and jointly reconstructing MRI images for the multiple contrasts based on the under-sampled data.

FIG. 2 illustrates an example of jointly determining the patterns for sampling a k-space to obtain under-sampled MRI data for multiple contrasts and jointly reconstructing MRI images for the multiple contrasts based on the under-sampled data. As shown, the sampling patterns (e.g., sampling masks) associated with the multiple contrasts may be determined using a multi-contrast MRI sampling mask generator (e.g., 202 shown in the figure) and the image reconstruction task may be performed using a multi-contrast MRI image reconstructor (e.g., 204 shown in the figure). Either or both of MRI sampling mask generator 202 and MRI image reconstructor 204 may be implemented using an artificial neural network (ANN), which may be trained to jointly optimizes the sampling patterns and/or the reconstruction operations for the multiple contrasts. In examples, MRI sampling mask generator 202 may be used to determine sampling masks (e.g., sampling patterns) for the multiple contrasts offline (e.g., in conjunction with the training of an MRI image reconstruction neural network included in MRI image reconstructor 204), and the determined sampling masks may be saved (e.g., in a system memory or database) for subsequent sampling of k-space 206 associated with multiple MRI contrasts (e.g., the sampling masks may be used by an MRI scanner to collect data for the multiple contrasts). As will be described in greater detail below, the determination of a sampling mask of one contrast may be coupled with that of another contrast and/or with the reconstruction of MRI images for the multiple contrasts. For instance, a sampling pattern determined for the first contrast may include parts of the k-space that may be re-used for the second contrast, so the sampling pattern for the second contrast may not need to include those parts of the k-space. In examples, MRI sampling mask generator 202 may be configured to determine the sampling patterns for the multiple contrasts offline and to further refine those sampling patterns at inference or run time, for example, based on performance criteria or metrics (e.g., such as an overall MRI acceleration rate) that may be provided to the MRI sampling mask generator at the inference or run time.

The sampling masks described herein may be generated in a differentiable manner (e.g., MRI sampling mask generator 202 may be a differentiable sampling mask generator) to facilitate the training of the neural network(s) used for the sampling and/or reconstruction tasks. For example, the masks used for under-sampling the k-space may be binarized to indicate the probability that a k-space location is to be sampled (e.g., 1 indicating sampling at the location and 0 indicating no sampling at the location). Such a binarization process, however, may not be differentiable and may not allow gradients to be backpropagated through a neural network. To allow for the backpropagation, a sigmoid function may be used to approximate the binarization process and determine the sampling mask (e.g., probabilities for sampling various locations of the k-space) for a certain MRI contrast. An example of the sigmoid function may be as follows:

$$\sigma_s(u^c \le p^c)$$

where $u^c \in \mathbb{C}^N$ may represent a realization of a random vector that may be uniformly distributed on [0,1], $p^c$ may represent a probability mask, $\sigma_s(t)$ may be set to $1/(1+e^{-st})$, and s may represent a slope. As will be described with greater detail below, during the training of a neural network, a binarization function may be used in a forward pass and during backpropagation, a gradient of the sigmoid function may be used as an approximation of the binarization function.

The reconstruction of an MRI image for a certain contrast (e.g., 208a, 208b, or 208c) may also be performed by considering information collected for other contrast(s). For example, MRI image reconstructor 204 may be configured to reconstruct, using an ANN, a first MRI image for a first contrast based on a first plurality of characteristics (e.g., features) extracted by the ANN from first under-sampled MRI data (e.g., which may be obtained for the first contrast using a first sampling pattern or mask). MRI image reconstructor 204 may further reconstruct, using the ANN, a second MRI image for a second contrast based on at least a subset of the first plurality of characteristics of the first under-sampled MRI data and a second plurality of characteristics extracted by the ANN from second under-sampled MRI data (e.g., the second under-sampled data may be obtained for the second contrast using a second sampling pattern or mask). In this manner, the overall quality of the image reconstruction operations may be improved, for example, by ensuring that the MRI images reconstructed for the different contrasts are consistent at least with respect to those features (e.g., characteristics) shared by the multiple contrasts. The reconstructed multi-contrast MRI images (e.g., 208a-208c) may then be used to facilitate various downstream tasks 210 including, for example, T2* mapping.

Figure 3:
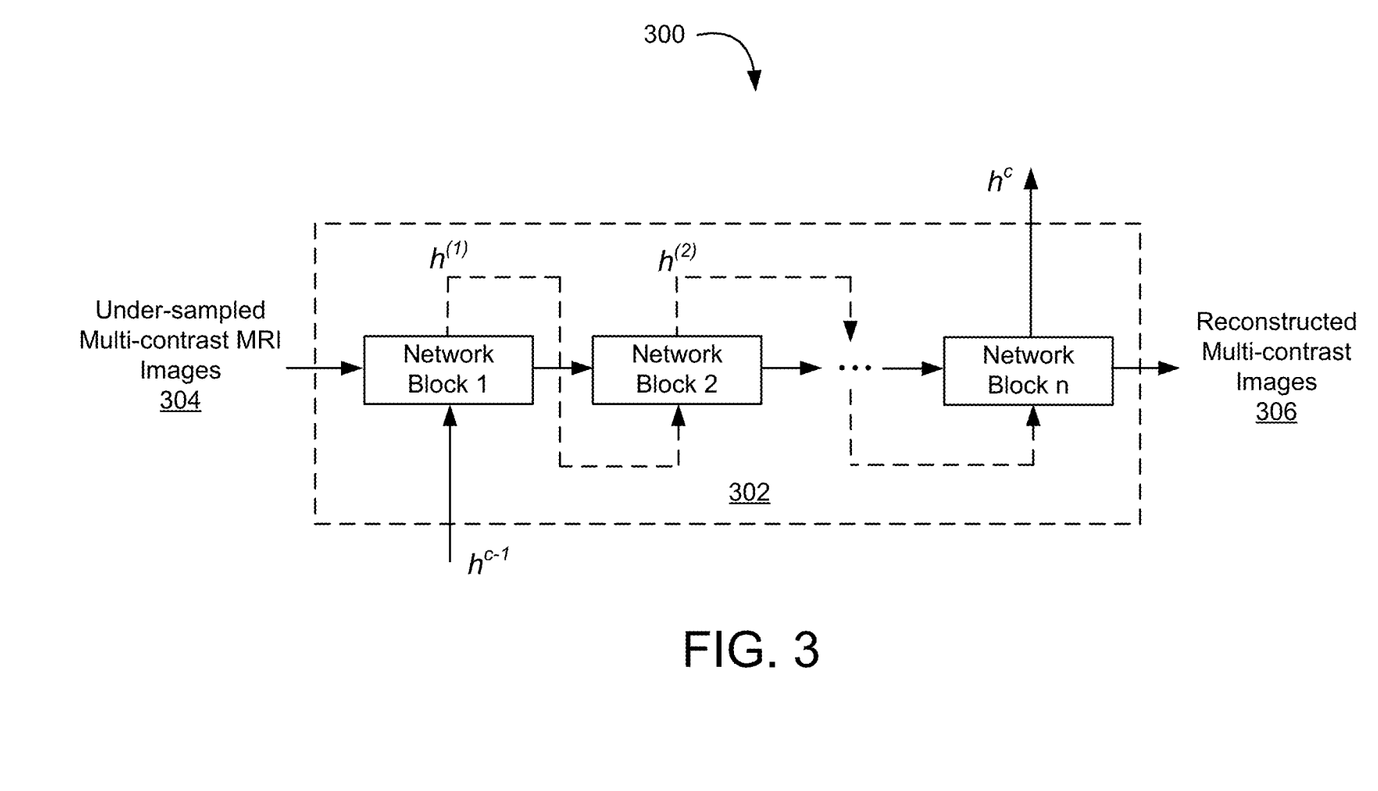
FIG. 3 is a simplified block diagram illustrating an example of a multi-contrast MRI reconstructor in accordance with one or more embodiments described herein.

FIG. 3 illustrates an example of a multi-contrast MRI reconstructor 300 (e.g., the multi-contrast MRI image reconstructor 204 of FIG. 2) that may be used to generate MRI images of different contrasts based on under-sampled MRI data collected for the contrasts. As shown, reconstructor 300 may be configured to perform the image reconstruction task using an artificial neural network such as a recurrent neural network (RNN) comprising one or more RNN cells 302. The artificial neural network may be trained to implement a machine-learned (ML) model that may take under-sampled MRI images 304 (or corresponding MRI data that may be used to obtain MRI images via IFFT) associated with multiple contrasts at inputs and generate reconstructed MRI images 306 (e.g., images 208a-208c of FIG. 2) for the multiple contrasts as outputs. For example, RNN cell 302 may be configured (e.g., trained) to take under-sampled MRI data (e.g., a zero-filled, under-sampled MRI image) associated with a current contrast c along with a hidden state $h^{c-1}$ of a previous contrast (e.g., contrast c−1), and output a reconstructed MRI image for the current contrast (e.g., a high-fidelity MRI image) and a hidden state $h^c$ of the current contrast for subsequent use (e.g., for processing a next contrast c+1). For instance, RNN cell 302 may be configured to reconstruct a first MRI image corresponding to a first contrast based on first under-sampled MRI data obtained for the first contrast (e.g., using a first sampling mask), and store information (e.g., features extracted from the first under-sampled MRI data) as a first hidden state. For a second contrast, RNN cell 302 may be further configured to take second under-sampled MRI data obtained for the second contrast (e.g., using a second sampling mask) and the stored hidden state of the first contrast as inputs, and reconstruct a second MRI image for the second contrast based on the inputs. RNN cell 302 may store information (e.g., features extracted from the second under-sampled MRI data) as a second hidden state to be used for additional contrasts (e.g., a third contrast, a fourth contrast, etc.). Using such a recurrent network architecture, correlations between the different contrast images (e.g., relating to the same underlying anatomic object) may be utilized to improve the quality of multi-contrast image reconstruction.

In examples, RNN cell 302 may include one or more (e.g., three) network blocks (e.g., stacked or concatenated network blocks) configured to extract features (e.g., in the form of one or more feature maps) from an input MRI image (e.g., an under-sampled MRI image) and predict a reconstructed MRI image based on the extracted features. In examples, each network block of RNN cell 302 may be configured to receive one or more inputs and generate one or more outputs based on the inputs. These inputs may include, for example, a hidden state associated with a previous contrast (e.g., the hidden state $h^c$ of each contrast may include respective hidden states $h^{(1)}$, $h^{(2)}$, $h^{(3)}$, etc. associated with the network blocks), and the outputs may include a hidden state that may be used by a subsequent network block and/or for a subsequent contrast.

Figure 4:
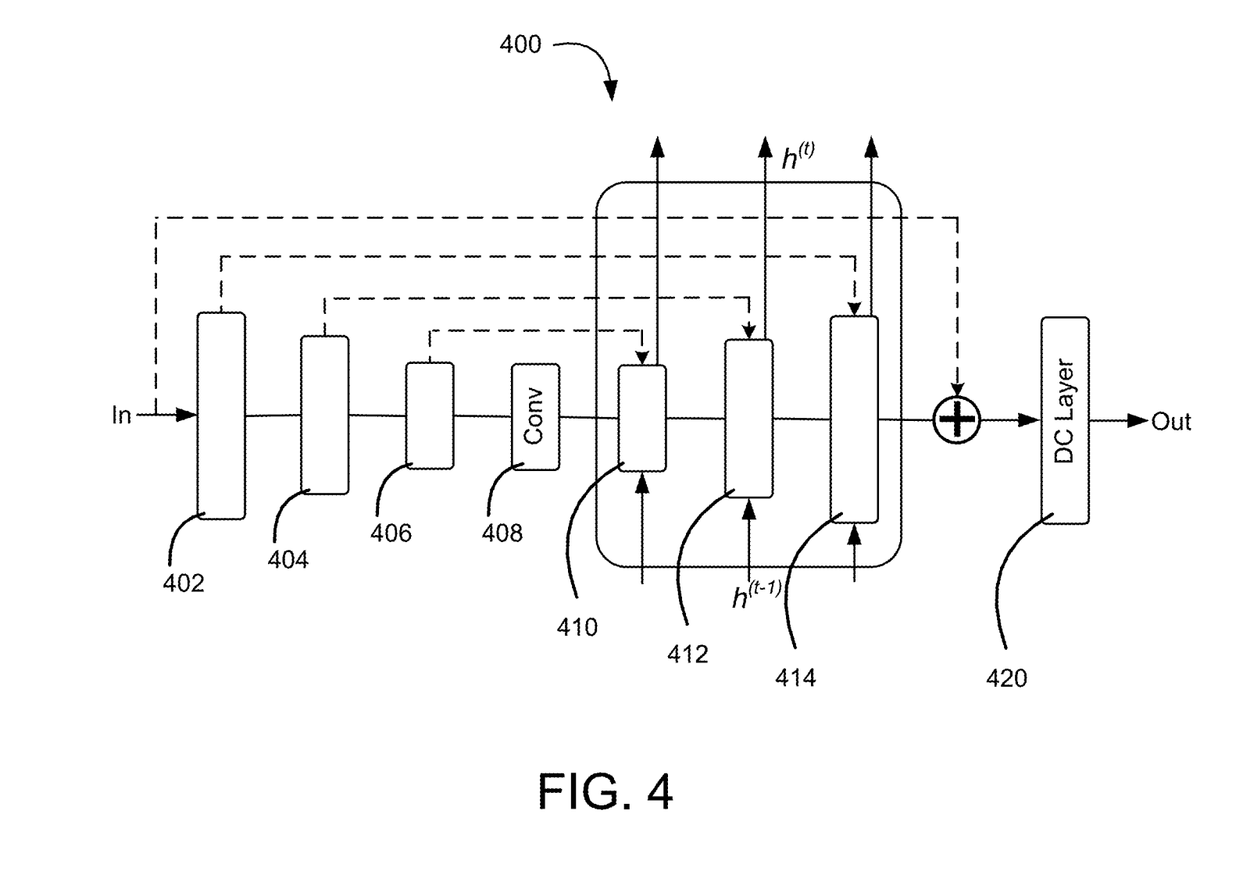
FIG. 4 is a simplified block diagram illustrating an example structure of an RNN block in accordance with one or more embodiments described herein.

FIG. 4 illustrates an example structure of a network block (e.g., Network Block 1, Network Block 2, etc., shown in FIG. 3) that may be included in an RNN cell (e.g., RNN cell 302 shown in FIG. 3). As shown, network block 400 (e.g., which may also be referred to herein as a sub-network) may include an input layer (not shown), a plurality of convolutional layers and/or transposed convolutional layers (e.g., 402-414 including bottleneck 408), an output layer (not shown), and/or a data consistency (DC) layer 416. The input layer may be configured to receive an under-sampled MRI image (e.g., derived from under-sampled MRI data via IFFT) for a certain MRI contrast, pre-process the input image, and/or pass the input image to the convolutional and/or DC layers. The convolutional layers (e.g., 402-406) may each include a plurality of convolution kernels or filters (e.g., 64/128/256/512 filters for each of 4 convolutional layers) having respective weights (e.g., corresponding to parameters of an ML model implemented by the neural network) that may be configured to extract features from the input image. The convolution operations may be followed by batch normalization and/or an activation function (e.g., such as a rectified linear unit (ReLu) activation function), and the features extracted by each of the convolutional layers may be down-sampled through one or more pooling layers and/or one or more fully connected layers to obtain a representation of the features, for example, in the form of a feature map or feature vector. Together, these convolutional layers, pooling layers, activation functions, and/or fully-connected layers may operate as a feature encoder and may be referred to as such herein.

The features extracted by the feature encoder may be passed (e.g., via a tensor) to one or more un-pooling layers (not shown in FIG. 4) and one or more (e.g., 4) transposed convolutional layers (e.g., decoder layers 410-414). Through the un-pooling layers and/or the transposed convolutional layers, the features extracted by the encoder may be up-sampled and further processed (e.g., via a plurality of deconvolution operations) to derive one or more up-scaled or dense feature maps or feature vectors. The dense feature maps or vectors may then be used to generate, e.g., at the output layer, a reconstructed MRI image (e.g., images 208a, 208b or 208c of FIG. 2) corresponding to the under-sampled image received at the input. Together, the un-pooling layers and/or the transposed convolutional layers (e.g., decoder layers 410-414) may operate as a feature decoder and may be referred to as such herein.

As shown in FIG. 4, each decoder layer (e.g., 412 shown in the figure) of network block 400 may be configured to receive as inputs a feature map or feature vector produced by a preceding decoder layer (e.g., 410), a feature map or feature vector produced by a corresponding encoder layer (e.g., via a skip connection from 404 to 412), and/or a hidden state h$^{t-1}$ (e.g., a convolution of the hidden state) associated with a previous contrast. Based on the inputs (e.g., a concatenation or combination of the inputs), the decoder layer may generate (e.g., via a set of convolution operations) an output that may include a set of up-sampled features (e.g., corresponding a certain scale or resolution) of the under-sampled MRI image received at the input. The set of up-sampled features may serve an input to the following decoder layer as well as a hidden state of the current contrast, and may be used to reconstruct an MRI image for the current contrast. For example, each decoder layer of the RNN may be configured to determine a respective first set of up-sampled features (e.g., in the form of a first feature map or a first feature vector) based on features extracted by an encoder layer from a first under-sampled MRI image for a first contrast, and store the respective first set of up-sampled features as a part of the hidden state of the first contrast. Each decoder layer may be further configured to determine a respective second set of up-sampled features (e.g., in the form of a second feature map or a second feature vector) based on features extracted by an encoder layer from a second under-sampled MRI image for a second contrast, and store the respective second set of up-sampled features as a part of the hidden state of the second contrast. The decoder layer may determine the respective second set of up-sampled features for the second contrast image based on first set of features determined by the decoder layers for the first contrast image (e.g., in addition to the features passed by an encoder via a skip connection and/or features determined by a preceding decoder layer). By passing (e.g., directly) the up-sampled features determined by each decoder layer between contrasts and/or network blocks, information obtained from one contrast or by one network block may be shared with another contrast or another network block so that useful information among the multiple contrasts and/or multiple network blocks may be retained and re-used.

As shown in FIG. 4, RNN block 400 may further include a data consistency (DC) layer 420 configured to ensure that the MRI image reconstructed (e.g., estimated) for a contrast be consistent with the actual MRI data. For example, DC layer 420 may be configured to apply FFT to the reconstructed image to obtain an estimated k-space. Data in the estimated k-space may then be compared with the under-sampled MRI data used to reconstruct the image to ensure data consistency is maintained during the reconstruction process. The comparison may be performed, for example, element-wise between the under-sampled MRI data and data of the estimated k-space at the sampling locations from which the under-sampled MRI data was collected.

Figure 5:
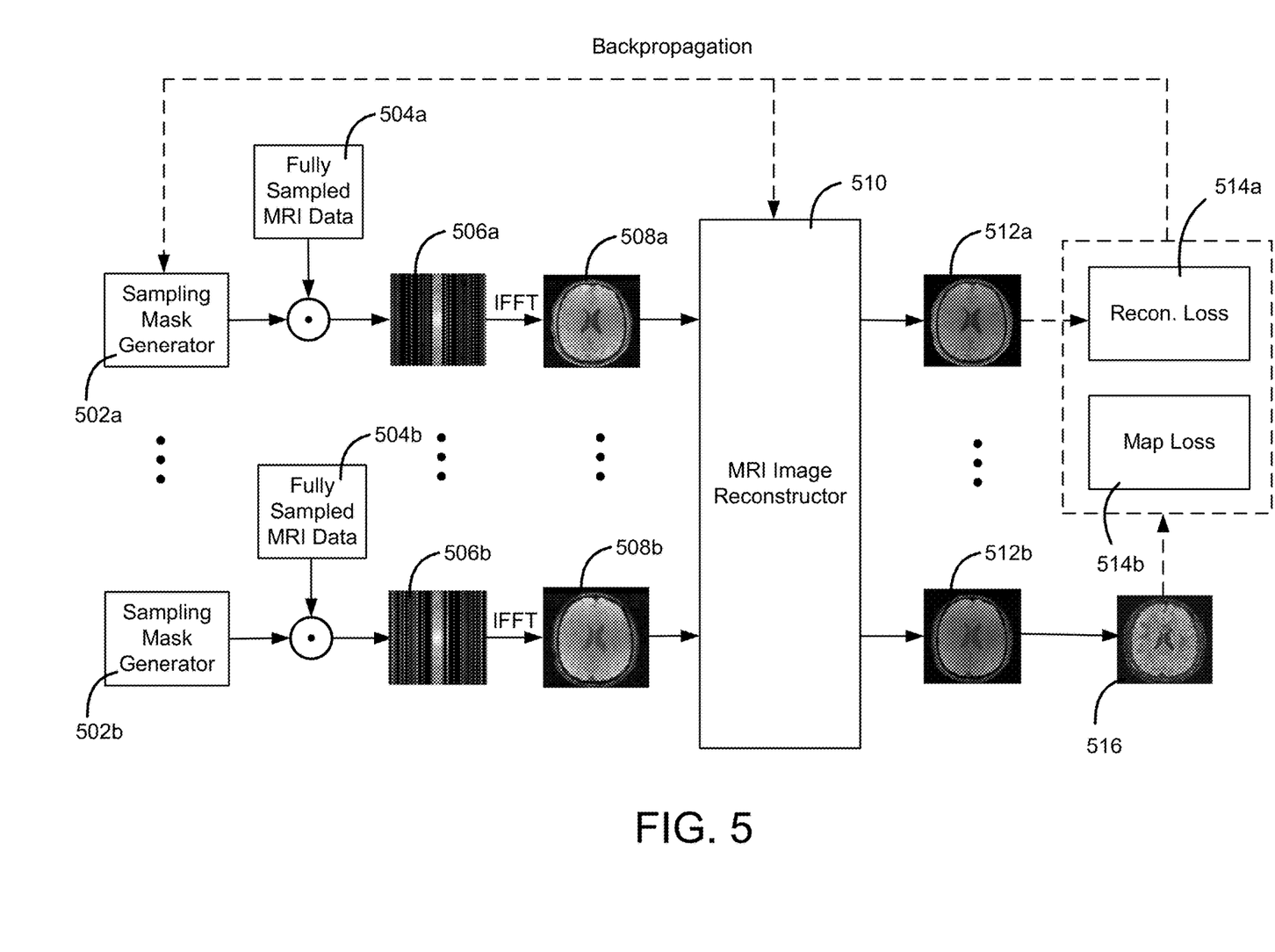
FIG. 5 is a simplified block diagram illustrating an example of training one or more artificial neural networks for performing sampling and/or reconstruction tasks in accordance with one or more embodiments described herein.

FIG. 5 illustrates an example of training one or more artificial neural networks (e.g., a sample mask generation neural network and/or an MRI image reconstruction neural network such as RNN 302 of FIG. 3) for performing the sampling and/or reconstruction tasks described herein. As shown, during the training, a first sampling mask may be predicted using sampling mask generator 502a (e.g., which may be a sampling mask generation neural network) and the estimated sampling mask may be applied to a fully-sampled MRI training dataset 504a for a first contrast (e.g., to emulate a real k-space) to obtain first under-sampled MRI training data 506a for the first contrast. Similarly, a second sampling mask may be predicted using sampling mask generator 502b (e.g., which may be the same sampling mask generation neural network as 502a) and the estimated sampling mask may be applied to a fully-sampled MRI training dataset 504b for a second contrast to obtain second under-sampled MRI training data 506b for the second contrast. First under-sampled MRI training data 506a and second under-sampled MRI training data 506b may then be converted (e.g., via IFFT) into under-sampled MRI images 508a and 508b, respectively, and provided to reconstruction neural network 510 (e.g., RNN 302 of FIG. 3) to predict first reconstructed MRI image 512a for the first contrast and second reconstructed MRI image 512b for the second contrast.

The prediction (e.g., of the sampling masks and/or the reconstructed images) may be made using preliminary parameters (e.g., weights) of the sampling neural network and/or the reconstruction neural network described herein, and one or more losses associated with the prediction may be determined and used to update the preliminary parameters of the neural network(s). For example, a first loss 514a may be directly determined based on the reconstruction of the multi-contrast MRI images by comparing predicted images 512a and 512b with respective ground-truth images and calculating a mean squared error (MSE), a structural similarity index measure (SSIM), an L1-norm, a peak signal-to-noise ratio (PSNR), a structural similarity index measure (SSIM), etc., based on the predicted images and the ground-truth images. Additionally, or alternatively, a second loss 514b may be determined based on a down-stream task such as T2* mapping that utilizes reconstructed multi-contrast images 512a and 512b. Second loss 514b may be determined, for example, based on an MSE between a fitted T2* map generated using MRI images 512a/512b and a ground truth T2* map.

Once determined, the loss(es) (e.g., a gradient descent of the loss(es)) described herein may be back-propagated through MRI image reconstructor 510 and/or sampling mask generator 502a/502b to update the parameters used to predict the sampling masks and/or the multi-contrast images, and/or to update the sampling masks predicted by sampling mask generator 502a/502b. The losses may be backpropagated individually (e.g., based on respective gradient descents of the losses) or as a combined loss (e.g., based on a gradient descent of an average of the losses). The back-propagation is possible at least partially because sampling masks 506a and 506b (e.g., probability masks) are made differentiable (e.g., by using a sigmoid function to approximate the binarization of the sampling masks). In examples, a binarization function may be used in a forward pass that may generate the sampling masks and, during backpropagation, a gradient of the sigmoid function may be used as an approximation of the binarization function.

In examples, the training described herein may be conducted on a multi-contrast 3D brain MRI dataset and/or a multi-contrast 3D knee dataset, both of which may be publicly available. In examples, a training dataset may include multiple subjects and for each subject there may be multiple MRI contrast such as different T2*-weighted contrasts. In examples, volumes in the training dataset may be sliced (e.g., in a transverse section), resulting in multiple training slices, validation slices, and/or slices for testing. The slices may be resized with a certain resolution (e.g., 256×224) and may be normalized by an image mean. The training may be conducted for a predetermined number of epochs (e.g., 100 epochs) with a predetermined learning rate (e.g., 0.01).

Using the training technique illustrated by FIG. 5, operations associated with sampling pattern determination and MRI image reconstruction may be jointly determined or optimized. The sampling and/or image reconstruction for one contrast (e.g., a first contrast) may also be jointly determined or optimized with the sampling and/or image reconstruction for another contrast (e.g., a second contrast).

Figure 6:
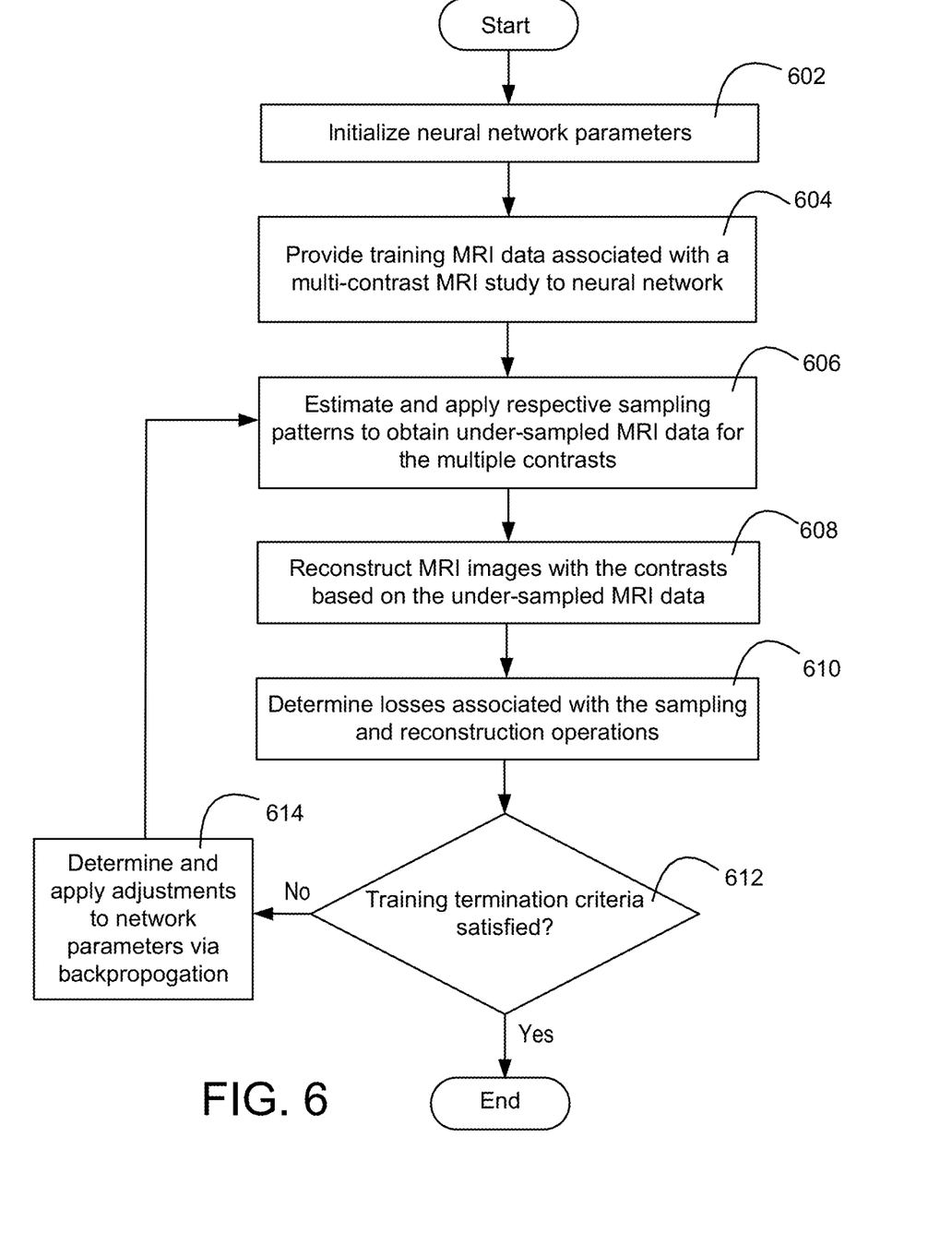
FIG. 6 is a simplified flow diagram illustrating example operations that may be performed for training a neural network in accordance with one or more embodiments described herein.

FIG. 6 illustrates example operations that may be performed while training a neural network (e.g., RNN 302 of FIG. 3) to perform the sampling and/or reconstruction tasks described herein. As shown, the training operations may include initializing parameters of the neural network (e.g., weights associated with the various filters or kernels of the neural network) at 602, for example, based on samples collected from one or more probability distributions or parameter values of another neural network having a similar architecture. The training operations may further include providing training data associated with a multi-contrast MRI study (e.g., fully sampled k-space data) to the neural network at 604, and causing the neural network to predict and apply respective sampling patterns to the training data to obtain under-sampled k-space data for each contrast at 606. The training operations may also include reconstructing MRI images based on the under-sampled k-space data (or under-sampled MRI images) for the multiple contrasts at 608 and determining various losses based on the outcome of the sampling/reconstruction operations and a desired outcome at 610. As described herein, the losses may include a reconstruction loss associated with the image prediction and/or a mapping loss associated with a down-stream task.

Once determined, the losses may be evaluated at 612, e.g., individually or as a combined loss (e.g., an average of the determined losses), to determine whether one or more training termination criteria have been satisfied. For example, a training termination criterion may be deemed satisfied if the loss(es) described above is below a predetermined thresholds, if a change in the loss(es) between two training iterations (e.g., between consecutive training iterations) falls below a predetermined threshold, etc. If the determination at 612 is that a training termination criterion has been satisfied, the training may end. Otherwise, the losses may be back-propagated (e.g., individually or as a combined loss) through the neural network (e.g., based on respective gradient descents associated with the losses or the gradient descent of the combined loss) at 614 before the training returns to 606.

For simplicity of explanation, the training steps are depicted and described herein with a specific order. It should be appreciated, however, that the training operations may occur in various orders, concurrently, and/or with other operations not presented or described herein. Furthermore, it should be noted that not all operations that may be included in the training process are depicted and described herein, and not all illustrated operations are required to be performed.

Figure 7:
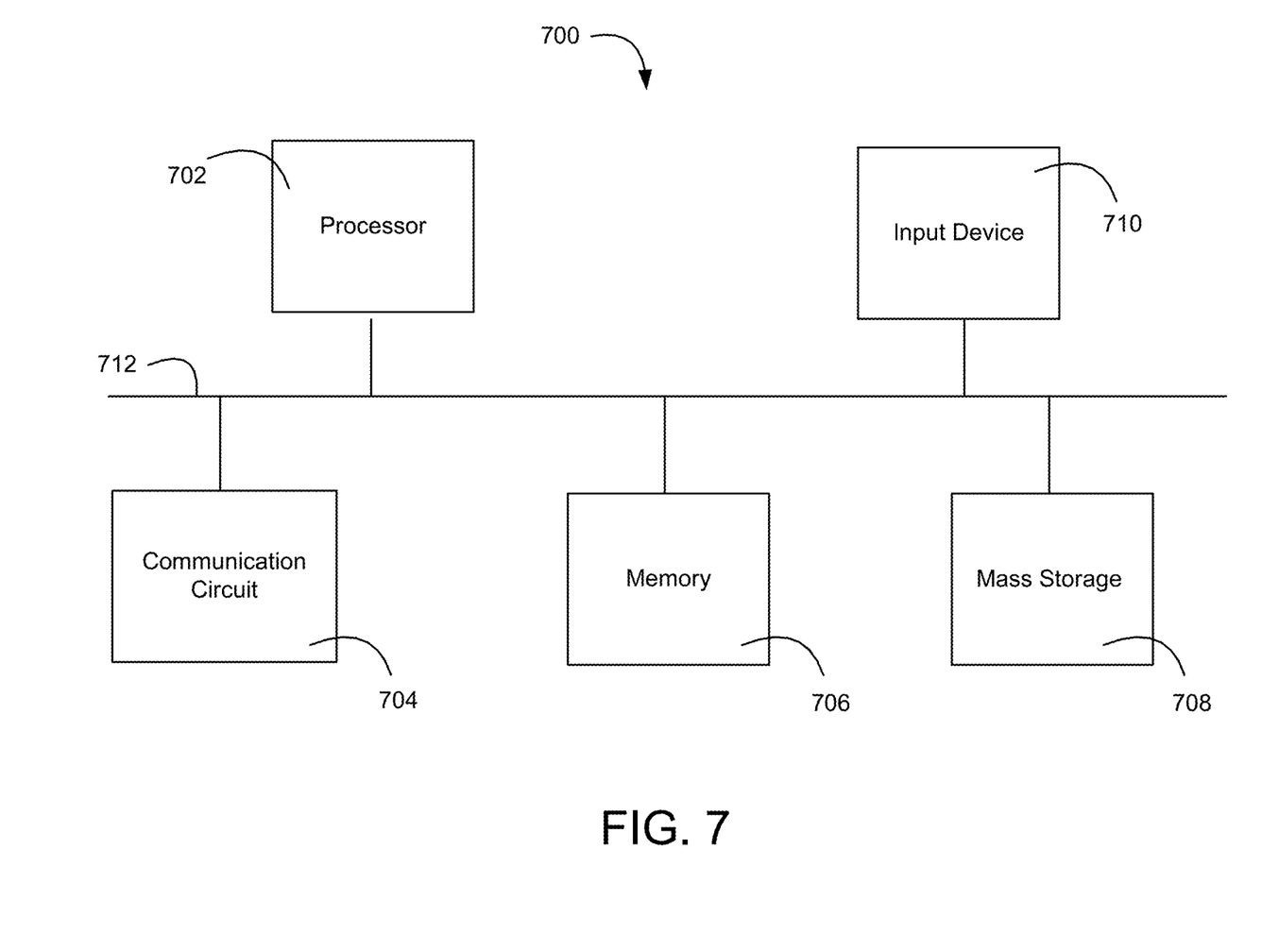
FIG. 7 is a simplified block diagram illustrating example components of an apparatus that may be configured to perform the tasks described in one or more embodiments provided herein.

The systems, methods, and/or instrumentalities described herein may be implemented using one or more processors, one or more storage devices, and/or other suitable accessory devices such as display devices, communication devices, input/output devices, etc. FIG. 7 is a block diagram illustrating an example apparatus 700 that may be configured to perform the joint sampling and reconstruction tasks described herein. As shown, apparatus 700 may include a processor (e.g., one or more processors) 702, which may be a central processing unit (CPU), a graphics processing unit (GPU), a microcontroller, a reduced instruction set computer (RISC) processor, application specific integrated circuits (ASICs), an application-specific instruction-set processor (ASIP), a physics processing unit (PPU), a digital signal processor (DSP), a field programmable gate array (FPGA), or any other circuit or processor capable of executing the functions described herein. Apparatus 700 may further include a communication circuit 704, a memory 706, a mass storage device 708, an input device 710, and/or a communication link 712 (e.g., a communication bus) over which the one or more components shown in the figure may exchange information.

Communication circuit 704 may be configured to transmit and receive information utilizing one or more communication protocols (e.g., TCP/IP) and one or more communication networks including a local area network (LAN), a wide area network (WAN), the Internet, a wireless data network (e.g., a Wi-Fi, 3G, 4G/LTE, or 5G network). Memory 706 may include a storage medium (e.g., a non-transitory storage medium) configured to store machine-readable instructions that, when executed, cause processor 702 to perform one or more of the functions described herein. Examples of the machine-readable medium may include volatile or non-volatile memory including but not limited to semiconductor memory (e.g., electrically programmable read-only memory (EPROM), electrically erasable programmable read-only memory (EEPROM)), flash memory, and/or the like. Mass storage device 708 may include one or more magnetic disks such as one or more internal hard disks, one or more removable disks, one or more magneto-optical disks, one or more CD-ROM or DVD-ROM disks, etc., on which instructions and/or data may be stored to facilitate the operation of processor 702. Input device 710 may include a keyboard, a mouse, a voice-controlled input device, a touch sensitive input device (e.g., a touch screen), and/or the like for receiving user inputs to apparatus 700.

It should be noted that the apparatus 700 may operate as a standalone device or may be connected (e.g., networked, or clustered) with other computation devices to perform the functions described herein. And even though only one instance of each component is shown in FIG. 7, a skilled person in the art will understand that apparatus 700 may include multiple instances of one or more of the components shown in the figure.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure. In addition, unless specifically stated otherwise, discussions utilizing terms such as "analyzing," "determining," "enabling," "identifying," "modifying" or the like, refer to the actions and processes of a computer system, or similar electronic computing device, that manipulates and transforms data represented as physical (e.g., electronic) quantities within the computer system's registers and memories into other data represented as physical quantities within the computer system memories or other such information storage, transmission or display devices.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

What is claimed is:
1. An apparatus, comprising:
one or more processors configured to:
obtain first under-sampled magnetic resonance imaging (MRI) data associated with a first contrast, wherein the first under-sampled MRI data is derived based on a first sampling pattern;

reconstruct a first MRI image associated with the first contrast using an artificial neural network (ANN), wherein the reconstruction of the first MRI image comprises determining a first plurality of characteristics of the first under-sampled MRI data and predicting the first MRI image based on the first plurality of characteristics of the first under-sampled MRI data;

obtain second under-sampled MRI data associated with a second contrast, wherein the second under-sampled MRI data is derived based on a second sampling pattern; and reconstruct, using the ANN, a second MRI image associated with the second contrast, wherein the first sampling pattern and the second sampling pattern are jointly determined, and wherein the reconstruction of the second MRI image comprises determining a second plurality of characteristics of the second under-sampled MRI data and predicting the second MRI image based on the second plurality of characteristics of the second under-sampled MRI data and at least a subset of the first plurality of characteristics of the first under-sampled MRI data.

2. The apparatus of claim 1, wherein the first sampling pattern and the second sampling pattern are jointly determined during training of the ANN.

3. The apparatus of claim 2, wherein the training of the ANN comprises:

applying a first estimated sampling pattern to an MRI training dataset to obtain first under-sampled MRI training data;

applying a second estimated sampling pattern to the MRI training dataset to obtain second under-sampled MRI training data;

generating, using the ANN, a first reconstructed MRI image based on the first under-sampled MRI training data;

generating, using the ANN, a second reconstructed MRI image based on the second under-sampled MRI training data; and adjusting the first estimated sampling pattern, the second estimated sampling pattern, and parameters of the ANN based on respective ground truths associated with the first reconstructed MRI image and the second reconstructed MRI image.

4. The apparatus of claim 3, wherein the first estimated sampling pattern, the second estimated sampling pattern, and the parameters of the ANN are further adjusted based on a quality of a task performed using the first reconstructed MRI image or the second reconstructed MRI image.

5. The apparatus of claim 2, wherein the first sampling pattern corresponds to a first differentiable probability mask and wherein the second sampling pattern corresponds to a second differentiable probability mask.

6. The apparatus of claim 1, wherein the ANN comprises a recurrent neural network (RNN) configured to determine the first plurality of characteristics of the first under-sampled MRI data and store the first plurality of characteristics as a hidden state of the first MRI image, the RNN further configured to determine the second plurality of characteristics of the second under-sampled MRI data and store the second plurality of characteristics as a hidden state of the second MRI image, the RNN further configured to reconstruct the second MRI image based on the hidden state of the first MRI image.

7. The apparatus of claim 6, wherein the RNN comprises a plurality of decoder layers each configured to determine, as a part of the hidden state of the first contrast, a respective first set of up-sampled features of the first under-sampled MRI data and determine, as a part of the hidden state of the second contrast, a respective second set of up-sampled features of the second under-sampled MRI data.

8. The apparatus of claim 7, wherein the respective first set of up-sampled features of the first under-sampled MRI data is used by the each of the plurality of decoder layers to determine the respective second set of up-sampled features of the second under-sampled MRI data.

9. The apparatus of claim 6, wherein the RNN comprises a plurality of network blocks and wherein each of the network blocks comprises a plurality of encoder layers, a plurality of decoder layers, and a data consistency (DC) layer.

10. A method for medical image reconstruction, the method comprising:

obtaining first under-sampled magnetic resonance imaging (MRI) data associated with a first contrast, wherein the first under-sampled MRI data is derived based on a first sampling pattern;

reconstructing a first MRI image associated with the first contrast using an artificial neural network (ANN), wherein the reconstruction of the first MRI image comprises determining a first plurality of characteristics of the first under-sampled MRI data and predicting the first MRI image based on the first plurality of characteristics of the first under-sampled MRI data;

obtaining second under-sampled MRI data associated with a second contrast, wherein the second under-sampled MRI data is derived based on a second sampling pattern; and reconstructing, using the ANN, a second MRI image associated with the second contrast, wherein the first sampling pattern and the second sampling pattern are jointly determined, and wherein the reconstruction of the second MRI image comprises determining a second plurality of characteristics of the second under-sampled MRI data and predicting the second MRI image based on the second plurality of characteristics of the second under-sampled MRI data and at least a subset of the first plurality of characteristics of the first under-sampled MRI data.

11. The method of claim 10, wherein the first sampling pattern and the second sampling pattern are jointly determined during training of the ANN.

12. The method of claim 11, wherein the training of the ANN comprises:

applying a first estimated sampling pattern to an MRI training dataset to obtain first under-sampled MRI training data;

applying a second estimated sampling pattern to the MRI training dataset to obtain second under-sampled MRI training data;

generating, using the ANN, a first reconstructed MRI image based on the first under-sampled MRI training data;

generating, using the ANN, a second reconstructed MRI image based on the second under-sampled MRI training data; and adjusting the first estimated sampling pattern, the second estimated sampling pattern, and parameters of the ANN based on respective ground truths associated with the first reconstructed MRI image and the second reconstructed MRI image.

13. The method of claim 12, wherein the first estimated sampling pattern, the second estimated sampling pattern, and the parameters of the ANN are adjusted further based on a quality of a task performed using the first reconstructed MRI image or the second reconstructed MRI image.

14. The method of claim 11, wherein the first sampling pattern corresponds to a first differentiable probability mask and wherein the second sampling pattern corresponds to a second differentiable probability mask.

15. The method of claim 10, wherein the ANN comprises a recurrent neural network (RNN) configured to determine the first plurality of characteristics of the first under-sampled MRI data and store the first plurality of characteristics as a hidden state of the first MRI image, the RNN further configured to determine the second plurality of characteristics of the second under-sampled MRI data and store the second plurality of characteristics as a hidden state of the second MRI image, the RNN further configured to reconstruct the second MRI image based on the hidden state of the first MRI image.

16. The method of claim 15, wherein the RNN comprises a plurality of decoder layers each configured to determine, as a part of the hidden state of the first contrast, a respective first set of up-sampled features of the first under-sampled MRI data and determine, as a part of the hidden state of the second contrast, a respective second set of up-sampled features of the second under-sampled MRI data.

17. The method of claim 16, wherein the respective first set of up-sampled features of the first under-sampled MRI data is used by the each of the plurality of decoder layers to determine the respective second set of up-sampled features of the second under-sampled MRI data.

18. The method of claim 15, wherein the RNN comprises a plurality of network blocks and wherein each of the network blocks comprises a plurality of encoder layers, a plurality of decoder layers, and a data consistency (DC) layer.

* * * * *